United States Patent
Yan et al.

(10) Patent No.: US 9,282,669 B2
(45) Date of Patent: Mar. 8, 2016

(54) POWER ELECTRONIC DEVICE AND AN ALIGNMENT DEVICE FOR THE POWER MODULE

(71) Applicant: DELTA ELECTRONICS, INC., Taoyuan Hsien (TW)

(72) Inventors: Kaitian Yan, Taoyuan Hsien (TW); Baoyu Liu, Taoyuan Hsien (TW); Minggang Chen, Taoyuan Hsien (TW)

(73) Assignee: DELTA ELECTRONICS, INC. (TW)

( * ) Notice: Subject to any disclaimer, the term of this patent is extended or adjusted under 35 U.S.C. 154(b) by 124 days.

(21) Appl. No.: 13/843,691

(22) Filed: Mar. 15, 2013

(65) Prior Publication Data

US 2014/0036453 A1     Feb. 6, 2014

(30) Foreign Application Priority Data

Aug. 3, 2012    (CN) .......................... 2012 1 0275331

(51) Int. Cl.
*H05K 7/14* (2006.01)
*H05K 7/18* (2006.01)

(52) U.S. Cl.
CPC ................ *H05K 7/14* (2013.01); *H05K 7/1454* (2013.01)

(58) Field of Classification Search
USPC .......... 361/727, 741, 756, 802; 439/377, 374; 235/483
See application file for complete search history.

(56) References Cited

U.S. PATENT DOCUMENTS

| | | | |
|---|---|---|---|
| 3,116,959 A | 1/1964 | Abodeely | |
| 5,466,171 A * | 11/1995 | Bixler et al. | 439/378 |
| 6,038,126 A * | 3/2000 | Weng | 361/679.01 |
| 6,246,580 B1 * | 6/2001 | Weng | 361/695 |
| 6,307,754 B1 | 10/2001 | Le et al. | |
| 6,561,836 B1 * | 5/2003 | Marshall et al. | 439/378 |
| 6,927,974 B2 * | 8/2005 | Robillard et al. | 361/679.4 |
| 7,234,960 B2 * | 6/2007 | Carullo | 439/378 |
| 7,525,809 B2 * | 4/2009 | Bergmann et al. | 361/752 |
| 8,014,159 B2 * | 9/2011 | Doblar et al. | 361/752 |
| 8,360,800 B1 * | 1/2013 | Finona | 439/378 |
| 2004/0244745 A1 | 12/2004 | Palesch et al. | |
| 2008/0298004 A1 | 12/2008 | Bailey et al. | |

FOREIGN PATENT DOCUMENTS

| | | |
|---|---|---|
| CN | 1600050 A | 3/2005 |
| CN | 201509094 U | 6/2010 |

OTHER PUBLICATIONS

Office Action issued on Mar. 25, 2015 by the CN Office.
Office Action issued on Jun. 30, 2015 by the TW Office.
2nd Office Action issued Nov. 6, 2015 by the CN Office.

\* cited by examiner

*Primary Examiner* — Hung S Bui
(74) *Attorney, Agent, or Firm* — Yunling Ren; Eaton & Van Winkle

(57) ABSTRACT

An alignment device for a power module of a power electronic device is provided, which may be used for aligning the power module while the power module being plugging to or from a rear mounting part of a cabinet of the power electronic device. The rear mounting part is disposed at an inner side of a back plate of the cabinet, the alignment device comprises a first connector disposed on the power module; guide rail units disposed on inner sides of a left side plate and a right side plate of the cabinet; a second connector disposed on the rear mounting part; and a guide device for limiting an offset of the power module moving along the guide rail unit.

18 Claims, 24 Drawing Sheets

(a) (b) (c) (d)

POWER ELECTRONIC DEVICE AND AN ALIGNMENT DEVICE FOR THE POWER MODULE

CROSS-REFERENCE TO RELATED APPLICATIONS

This application claims benefits of Chinese Patent Application No. 201210275331.7, filed on Aug. 3, 2012 in the State Intellectual Property Office of China, the disclosure of which is incorporated herein by reference in its entirety.

TECHNICAL FIELD

The present application relates to an alignment device for a power module of a power electronic device, and an alignment device for plugging the power module of the power electronic device.

BACKGROUND

Conventionally, in the field of power electronic devices, it is necessary to dispose one or more power modules in a cabinet of a power electronic device. As shown in FIG. 1, a chamber is defined in the cabinet by a left side plate 13, a right side plate 14, a top plate 15, a bottom plate 16, and back plate 17. When the power module 31, as shown in FIG. 2, is plugged in, it is plugged (or mounted) from a front end of the chamber toward the back plate 17 at a rear end of the chamber. When the power module 31 is plugged out (dismounted out), the power module 31 is moved from the rear end of the chamber to the front end of the chamber. The plugging in and plugging out of the power module 31 will be collectively referred to as plugging of the power module 31 hereinafter.

Connectors are used for connecting the power module 31 with the cabinet. Generally, the connectors are aligned or positioned by directly interconnecting a male connector and a female connector. Conventionally, as shown in FIG. 2, the power module 31 is supported on a left guide rail 32 and a right guide rail 33, and the plugging of the power module 31 in a depth direction of the left and right guide rails 32, 33 is performed by fitting of a connector plug 35 and a connector socket 34. The connectors, the plug 35 and the socket 34, are aligned or positioned mainly by using pins of the plug 35.

Thus, it is needed to improve the positioning manner of the related art. For example, as the left and right rails 33 are not designed for precise positioning, it is difficult to accurately perform positioning for the coupling of the connectors due to accumulated tolerance in manufacturing and assembling, which may reduce reliability of the power electronic products. Moreover, the situation would be worse if the weight of the power module 31 is increased, which may results in damage of the connectors due to a high mechanical stress.

SUMMARY

Further scope of applicability of the present disclosure will become apparent from the detailed description given hereinafter. However, it should be understood that the detailed description and specific examples, while indicating exemplary embodiments of the invention, are given by way of illustration only, since various changes and modifications within the spirit and scope of the disclosure will become apparent to those skilled in the art from the following detailed description.

According to an aspect of the invention, an alignment device for a power module of a power electronic device is provided, which may be used for aligning the power module while the power module being plugging to or from a rear mounting part of a cabinet of the power electronic device. The rear mounting part is disposed at an inner side of a back plate of the cabinet, the alignment device comprises a first connector disposed on the power module; guide rail units disposed on inner sides of a left side plate and a right side plate of the cabinet; a second connector disposed on the rear mounting part; and a guide device for limiting an offset of the power module moving along the guide rail unit. A movement of the power module toward the rear mounting part along the guide rail unit causes the first connector to connect to the second connector, such that the first connector is electrically connected to the second connector. The guide device comprises a guide part and an alignment part, and one end of the guide part away from the alignment part is a receiving end. The receiving end defines a first offset of the power module, the alignment part defines a second offset of the power module, the guide rail unit defines a third offset of the power module, the connection between the first connector and the second connector defines a fourth offset of the power module. The first offset is equal to or greater than the third offset, the fourth offset is equal to or greater than the second offset.

According to another aspect of the invention, a power electronic device is provided, which comprises the alignment device as above described.

For example, the guide device further comprises a receiving part connected with the receiving end and having a same width as that of the receiving end.

For example, the guide device is a ridge or a bump group disposed on an inner surface of the guide rail unit.

For example, the ridge or each bump of the bump group has a cross section of an arc shape.

For example, the guide device comprises a guide post and a guide sleeve fitting each other, with one of the guide post and the guide sleeve disposed on the power module, and the other disposed on an inner side of the rear mounting part; and the guide part is disposed at a top end of the guide post and/or an opening end of the guide sleeve.

For example, the top end of the guide part is provided with a chamfer.

For example, a distance from a top of the first connector to a top of the second connector is greater than a distance from the top end of the guide post to the opening end of the guide sleeve.

For example, the guide rail unit comprises two separated guide rails in L, U or C shape.

For example, the guide rail unit is an integral guide rail in a U or rectangle shape.

For example, a ridge or a bump group is disposed on an inner surface of the guide rail unit.

For example, the ridge or each bump of the bump group has a cross section of an arc shape.

For example, a handle unit is disposed at a front panel of the power module.

For example, the guide device further comprises a ridge or a bump group disposed on an inner surface of a top of the guide rail unit, which forms a guide part and an alignment part.

For example, the ridge or the bump group disposed on the inner surface of the top of the guide rail unit and the ridge or the bump group disposed on the inner side surface of the guide rail unit have same shapes.

For example, the rear mounting part is disposed on an inner surface of the back plate.

For example, the rear mounting part is disposed on two mounting rack inside the back plate.

For example, the rear mounting part is disposed at a rear end of the guide rail unit.

BRIEF DESCRIPTION OF THE DRAWINGS

The present disclosure will become more fully understood from the detailed description given hereinafter and the accompanying drawings which are given by way of illustration only, and thus are not limitative of the present disclosure.

Figure 1:
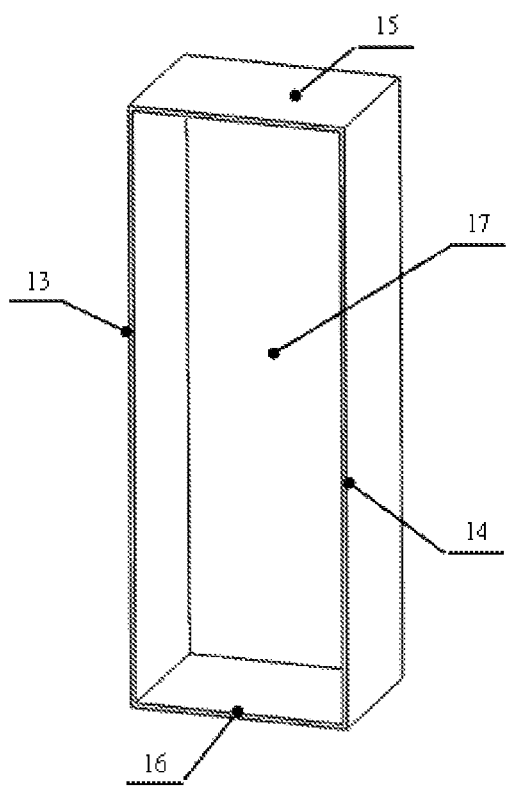
FIG. 1 is schematic diagram showing a chamber formed in a cabinet of a power electronic device according to the related art.
Figure 2:
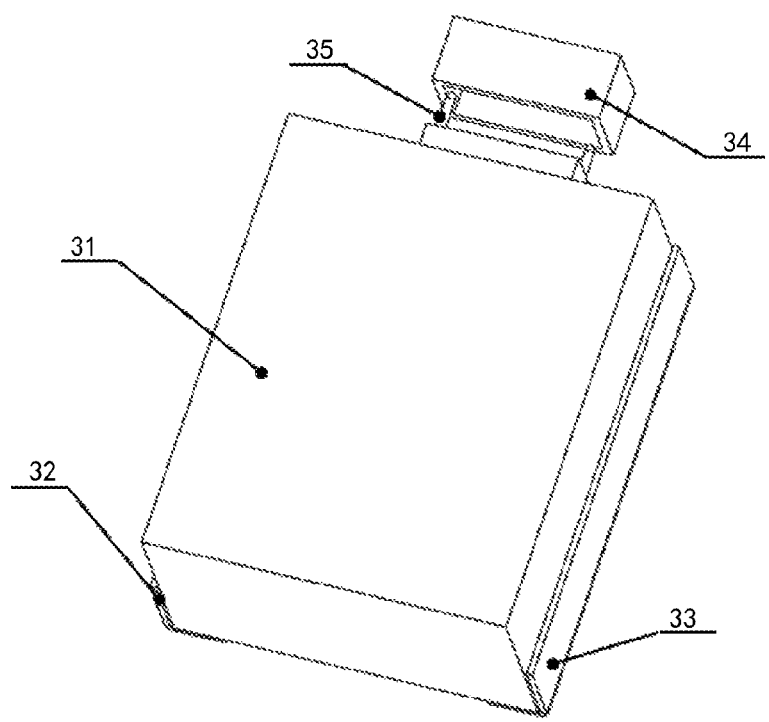
FIG. 2 is schematic diagram showing a plugging process of a power module of the power electronic device according to the related art.

The reference numerals in the drawings are listed as follows:

1: guide post unit
2: guide rail unit
3: guide sleeve unit
4: left guide rail
5: power module
6: handles
7: right guide rail
8: plug
9: guide post
10: guide sleeve
11: socket
12: rear mounting part
13: left side plate
14: right side plate
15: top plate
16: bottom plate
17: back plate
18: receiving end
19: guide part
20: alignment part
21: receiving end
22: guide part
23: alignment part
24: guide part
25: chamfer
26: bump group
27: bump group
28: ridge
29: ridge
30: bump group
31: power module
32: left guide rail
33: right guide rail
34: socket
35: plug
90: alignment part
121, 122: mounting rack
160: guide rail
A1: distance between the left and right guide rails
A2: width of power module
B1: inner diameter of the socket
B2: outer diameter of the socket
C1: inner diameter of the alignment part of the guide sleeve
C2: outer diameter of the alignment part of the guide post
D1: inner diameter of the receiving end of the guide part of the guide sleeve
D2: outer diameter of the front end of the guide post
L1: distance between the top end of the guide post and the opening end of the guide sleeve
L2: distance between the top of the plug and the top of the socket

DETAILED DESCRIPTION

Several exemplary embodiments which reflect the characteristics and advantages of the present disclosure will be described in detail. The disclosure may, however, be embodied in many different forms without departing from the principles of the disclosure. Moreover, the following detailed description of the embodiments of the disclosure and the accompanying drawings are provided so that this disclosure will be thorough and complete, and should not be construed as limiting the present disclosure.

Figure 23:
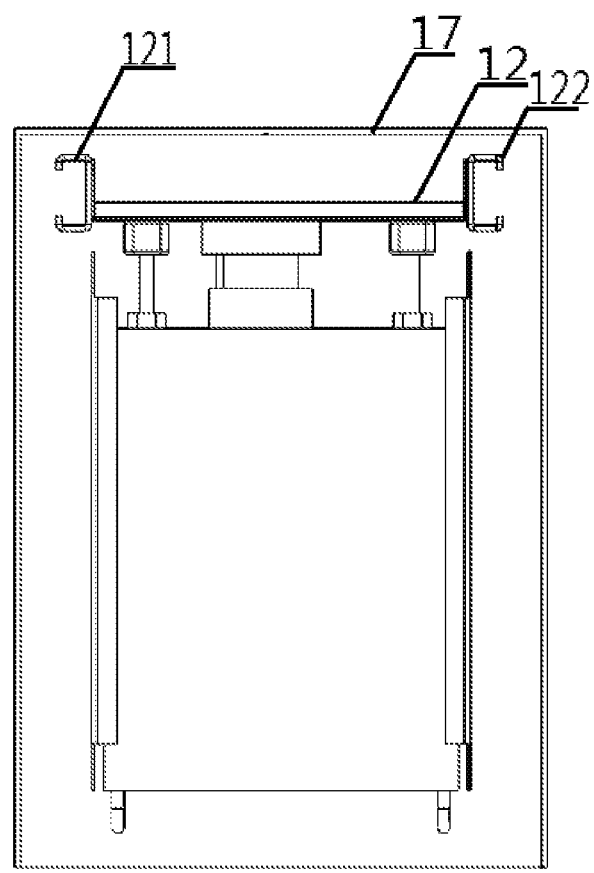
FIG. 23 is a schematic diagram showing an implementation for a rear mounting part of the power electronic device according to an embodiment of the disclosure.

The alignment device for the power module according to an embodiment of the present disclosure can be applied to various power electronic devices such as power factor correctors, uninterruptible power supplies, active power filters, and so on. However, it is not limited thereto, rather, it can be applied to any power electronic device requiring use of a power module. According to an embodiment of the present disclosure, the power electronic device may comprise a power module 5, a cabinet, a rear mounting part 12, and an alignment device for the power module. The alignment device comprises a first connector disposed on the power module 5, guide rail units 2 disposed on inner sides of left and right side plates of the cabinet, and a second connector disposed on the rear mounting part 12. The rear mounting part 12 is disposed on an inner side of the back plate 17 of the cabinet, i.e., the rear mounting part 12 may be directly locked and fixed on the back plate of the cabinet (i.e., on an inner surface of the back plate 17), or be directly locked and fixed to a rear end of the guide rail unit 2 (the rear end of the guide rail unit 2 is an end close to the back plate of the cabinet). Alternatively, as shown in FIG. 23, two mounting racks 121, 122 may be disposed inside the cabinet at positions near the back plate 17. The mounting racks 121, 122 do not contact the back plate 17, but have their heights extending in a direction from a bottom of the back plate 17 to a top of the back plate 17 (in a direction out of the paper plane as shown in FIG. 23) to an extent which may be determined according to specific requirements, as long as the heights of the mounting racks 121, 122 can guarantee the second connector on the mounting racks and the first connector on the power module 5 can fit each other correctly. And then the rear mounting part 12 may be disposed on the two mounting racks 121, 122. It should be noted that, in the specification, if a first part is described as positioned on an "inner side" of a second part, it means, in a direction from inside to outside, the first part is located within the second part, including being at a position on or near an inner surface of the second part. The first part may not directly contact the second part. For the back plate 17, the left side plate 13 and the right side plate 14 which constitute the cabinet, the inside and outside directions are termed in view of the inner space and the outer space of the cabinet.

The alignment device for the power module will be discussed according to three embodiments of the present disclosure.

First Embodiment

Figure 3:
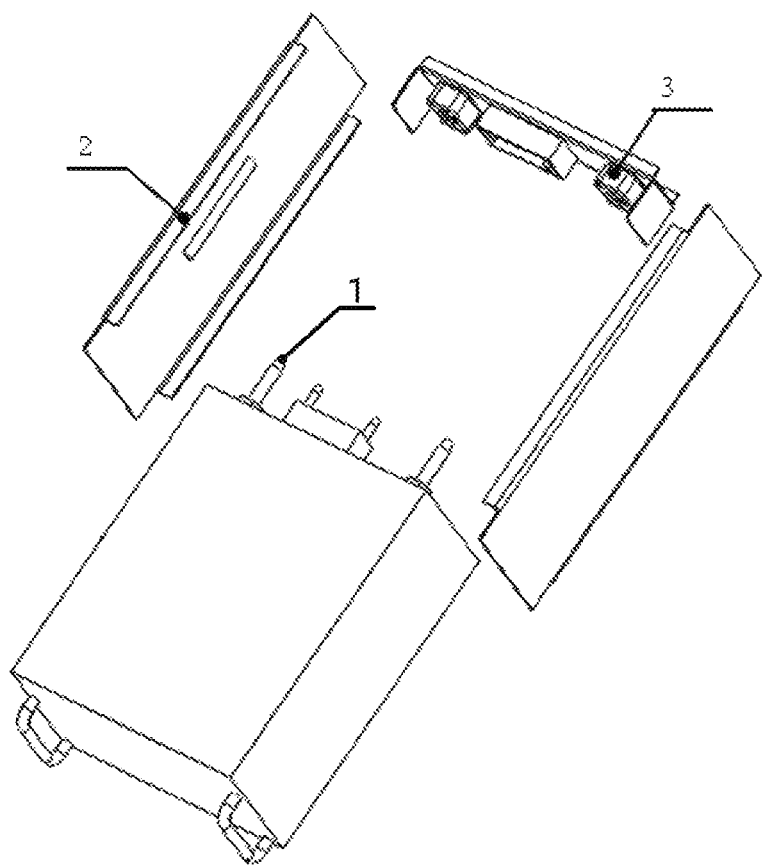
FIG. 3 is an exploded perspective view showing an alignment device for a power module according to a first embodiment of the disclosure.
Figure 4:
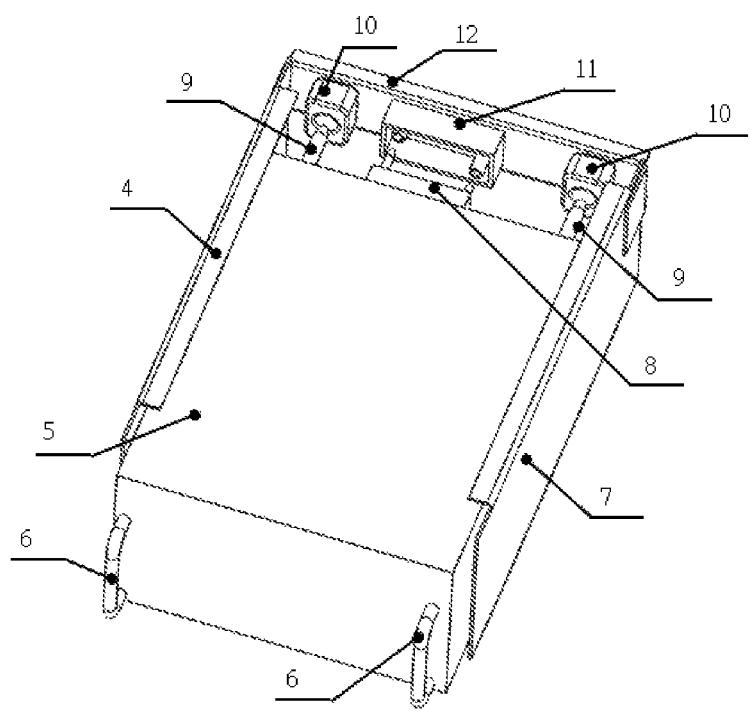
FIG. 4 is a schematic perspective view showing a plugging process of the power module using an alignment device according to the first embodiment of the disclosure.
Figure 5:
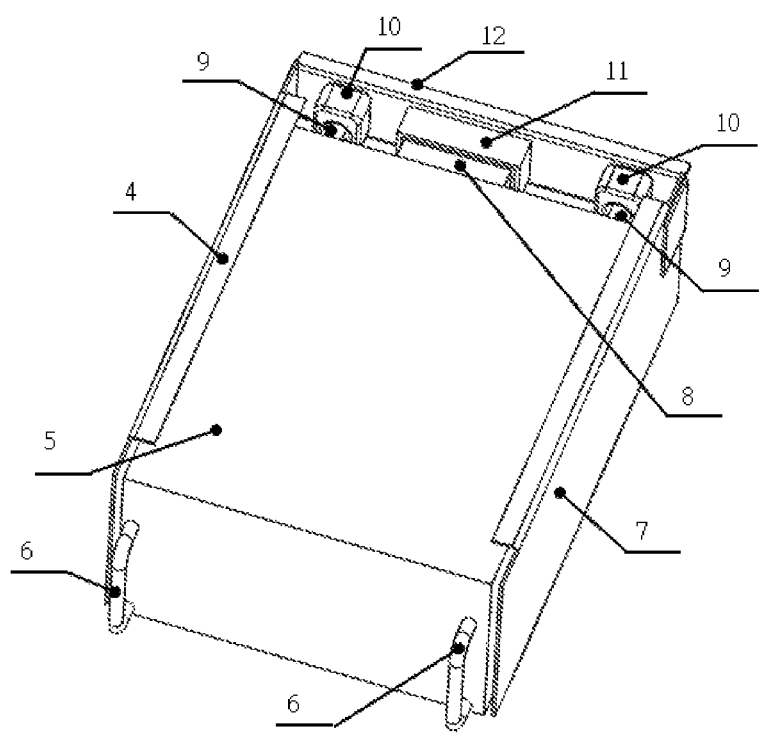
FIG. 5 is a schematic perspective view showing the power module has been mounted using an alignment device according to the first embodiment of the disclosure.

As shown in FIGS. 3-5, the alignment device for the power module in the first embodiment has a guide device for accurately aligning the power module 5 in plugging. Generally, the guide device performs a primary positioning based on positioning with the guide rail unit 2, and is designed to have accurate sizes of guide post unit 1 and a guide sleeve unit 3 to perform a secondary positioning, so as to achieve an accurate alignment. Thus, the plugging operation of the power module 5 is easy, safe and reliable. Moreover, the power electronic device has a compact structure, and an improved reliability.

Particularly, as shown in FIGS. 3-4, the alignment device for the power module in the first embodiment comprises the guide rail unit 2, a first connector and a second connector.

The guide rail unit 2 may be disposed on inner sides of the left and right side plates of the cabinet of the power electronic device. The guide rail unit may contact, directly or indirectly, the left side plate 13 and the right side plate 14. The rear mounting part 12 of the cabinet is mounted on the inner side of the back plate 17 of the cabinet. The first connector is disposed at a rear end of the power module 5, that is, the first connector is a plug 8 shown in FIGS. 4 and 5. Moreover, the second connector is disposed on an inner surface of the rear mounting part 12, that is, the second connector is a socket 11 shown in FIGS. 4 and 5 which fits the plug 8. Without a doubt, the first connector may be the socket 11, and the second connector may be the plug 8. In other words, the plug 8 may be disposed on the inner surface of the rear mounting part 12, and the socket 11 may be disposed at the rear end of the power module 5. In this specification, for the power module 5, one end thereof which is relatively close to the inner side of the rear mounting part 12 of the cabinet is the rear end, and the other end thereof which is away from the inner side of the rear mounting part 12 of the cabinet is the front end. While inserting the power module 5, the power module 5 moves toward the rear mounting part 12 along the guide rail unit 2, such that the plug 8 and the socket 11 are connected (mechanically connected), and thus an electric connection between the plug 8 and the plug 11 is achieved.

As shown in FIGS. 3-5, the alignment device for the power module in the first embodiment further comprises the guide device for limiting an offset of the power module 5 moving along the guide rail unit 2. The guide device is consisted of the guide post unit 1 disposed at the rear end of the power module 5 and the guide sleeve unit 3 disposed on the rear mounting part 12 (specifically, the rear mounting part 12 may be a rear mounting beam). Without a doubt, the guide post unit 1 and the guide sleeve unit 3 may exchange their positions. That is, the guide post unit 1 may be disposed on the rear mounting part 12, and the guide sleeve unit 3 may be disposed at the rear end of the power module 5. The guide post unit 1 and the guide sleeve unit 3 are used for secondary positioning of the power module 5 in plugging. In order to improve balance and reliability, the guide post unit 1 comprise a pair of guide posts 9 which are symmetrically disposed at positions close to opposite edges of the power module 5 in a width direction (or a lateral direction. Plugging of the power module 5 is performed in a longitudinal direction of the power module 5) of the power module 5. Correspondingly, the guide sleeve unit 3 comprises a pair of guide sleeves 10 which are symmetrically disposed at positions close to opposite ends of the rear mounting part 12, to distribute local mechanical stress when the plug 8 and the socket 11 are connected.

Figure 11:
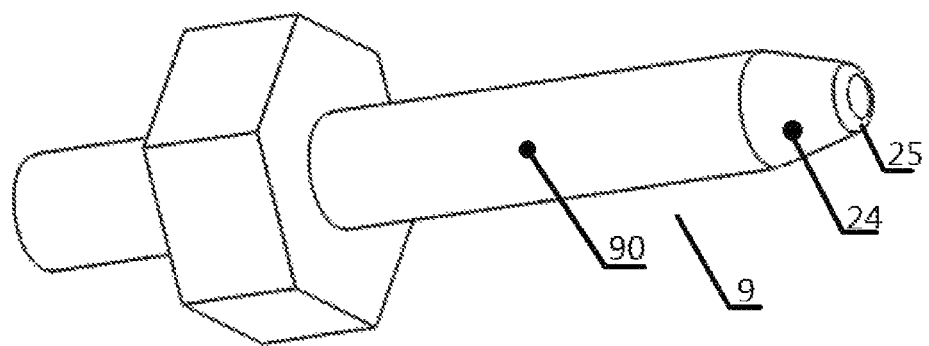
FIG. 11 is a schematic perspective view showing a guide post of the alignment device for the power module according to the first embodiment of the disclosure.

As shown in FIG. 5, a handle unit is symmetrically disposed on the front panel of the power module 5. The handle unit may be a pair of handles 6 for plugging the power module better and more easily with less effort. The handles 6 are locked to the front panel of the power module 5, and both the plug 8 and the guide post 9 are locked to a rear end plate (or termed as rear panel) of the power module 5. Thus, the handles 6, the plug 8 and the guide post 9 would move as a whole with the power module 5. The guide post 9 is required to be subject to heat treatment such as quench or anneal treatment, so as to improve its stiffness, hardness and wear resistance. As shown in FIG. 11, a top of the guide post 9, i.e. a portion of the guide post 9 first contacting the guide sleeve 10, is provided with a guide part 24, so as to better guide the guide post 9 to be mounted inside the guide sleeve 10, thereby a purpose of accurately aligning is realized. The rear end of the guide part 24 is provided with an alignment part 90, and the top end of the guide part 24 (i.e., a receiving end of the guide part 24) is provided with a chamfer 25 for protecting an inner surface of the guide sleeve 10 contacting the guide post 9 by distributing local stress at the portion where the guide sleeve 10 contacts the guide post 9.

Figure 6:
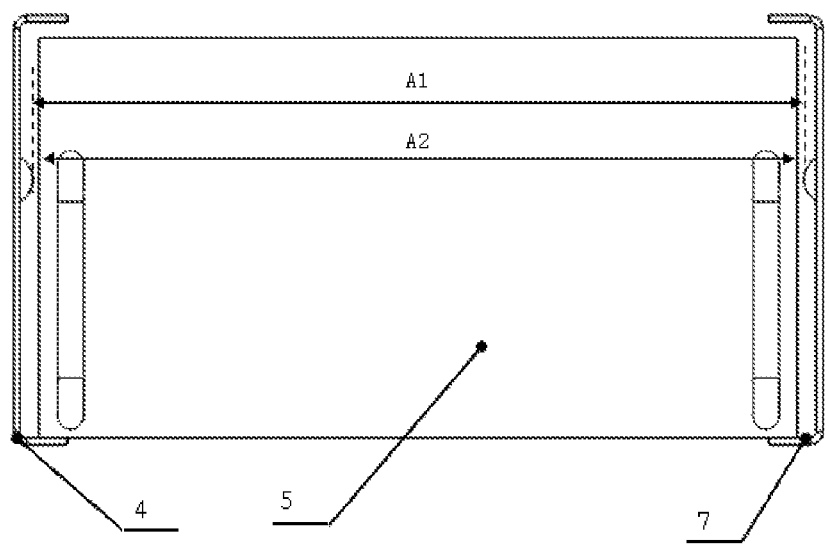
FIG. 6 is a schematic front view showing the plugging process of the power module using the alignment device according to the first embodiment of the disclosure.
Figure 12:
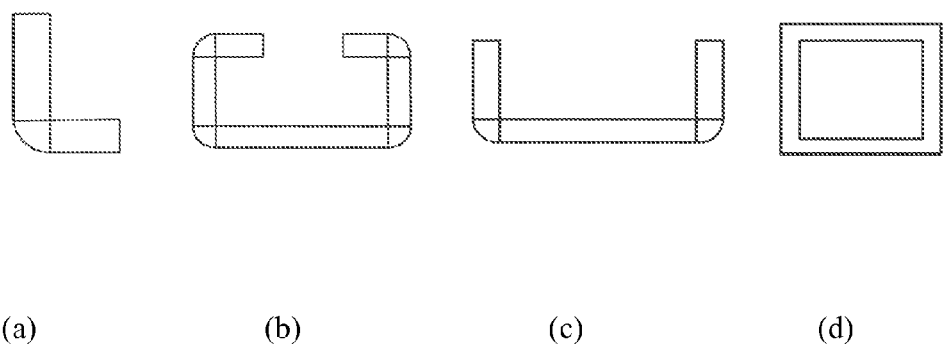
FIG. 12 is a schematic diagram showing a guide rail of the alignment device for the power module according to the first embodiment of the disclosure.
Figure 24:
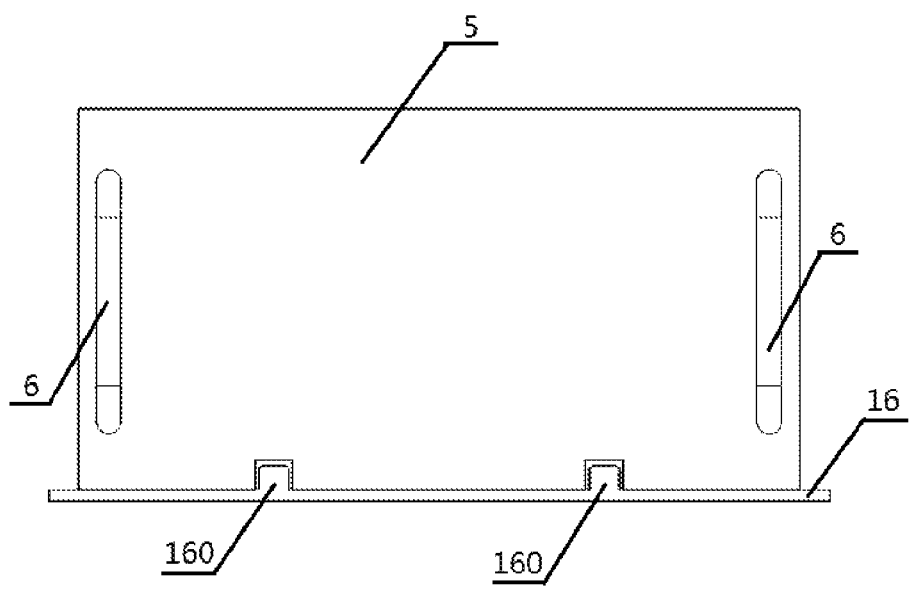
FIG. 24 is a schematic diagram showing an implementation for the guide rail unit in the alignment device for the power module according to an embodiment of the disclosure.

The guide rail unit 2 is a component for primary positioning during plugging of the power module 5. The guide rail unit 2 guides and supports the power module 5 to move in the cabinet, performing a function of positioning and guiding. The guide rail unit 2 mainly ensures conveniently plugging (dismounting and mounting) of the power module 5. In this embodiment, as shown in FIG. 6, the guide rail unit 2 comprises a left guide rail 4 and a right guide rail 7 both in U shape. The left guide rail 4 and the right guide rail 7 are locked and fixed on inner surfaces of the left side plate and the right side plate in the cabinet, respectively. The guide rail unit 2 may be embodied in different forms. For example, in this embodiment, the guide rail unit comprises two separate rails in U shape; however, the guide rail unit may comprise separated rails in L or C shape instead, as shown in FIGS. 12 (a) and (b). In addition, except two separate guide rails, the guide rail unit 2 may consist of an integral guide rail in a U or rectangle shape, as shown in FIGS. 12 (c) and (d). The guide rail in rectangle shape can surround the power module 5 during plugging of the power module 5. The guide rail unit 2 adopting U shape in this embodiment has the advantages of providing a good mechanical strength and a compact structure. In addition, the left guide rail 4 and the right guide rail 7 may be replaced by a guide rail 160 disposed at the bottom of the power module 5, as shown in FIG. 24. The guide rail 160 guides and supports the power module 5 to move in the cabinet, performing a function of positioning and guiding.

Figure 10:
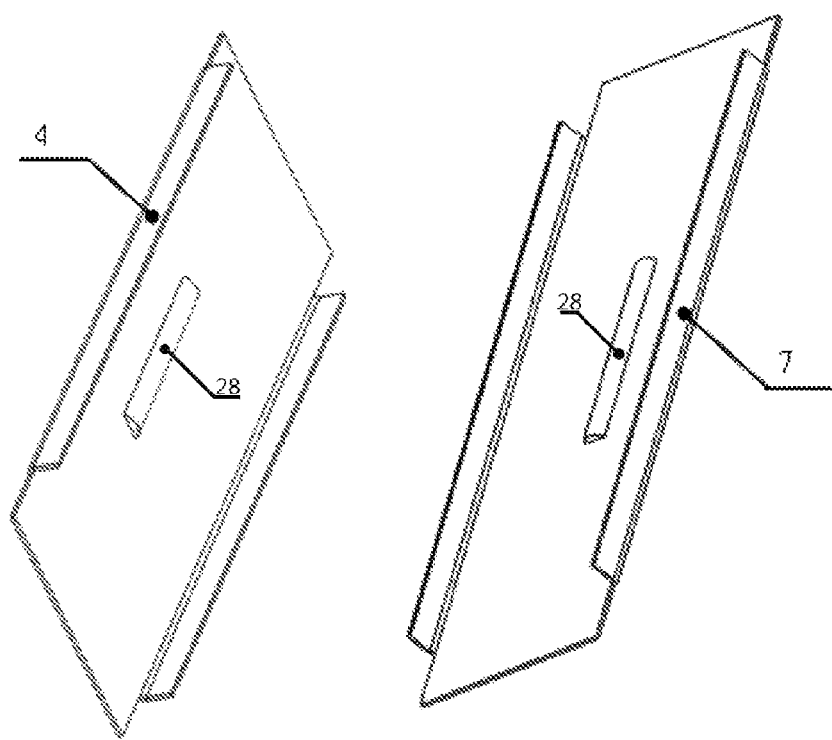
FIG. 10 is schematic diagram showing a guide rail unit of the alignment device for the power module according to the first embodiment of the disclosure.
Figure 13:
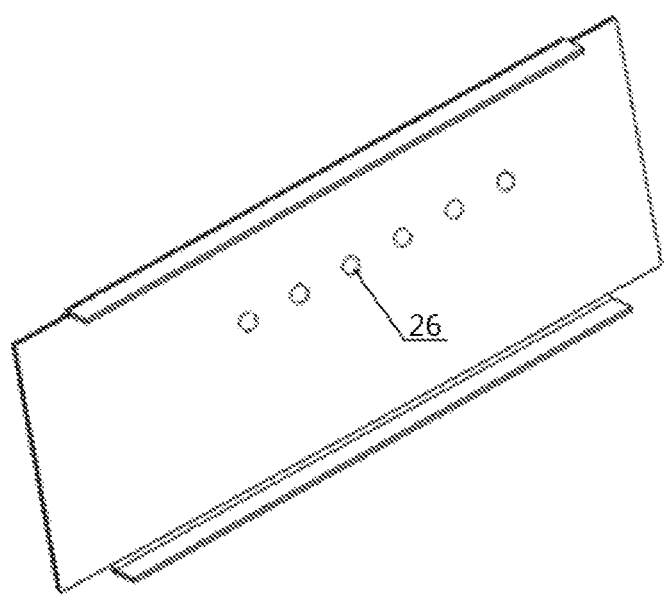
FIG. 13 is a schematic diagram showing a bump group on an inner surface of the guide rail of the alignment device for the power module according to the first embodiment of the disclosure.

As shown in FIG. 10, each of inner surfaces of the left guide rail 4 and the right guide rail 7, i.e. on the sides near the power module, is designed to have a ridge 28 having a cross section in an arc shape (here the cross section refers to a section taken by cutting the ridge 28 with a plane which is parallel to the rear mounting part 12 and perpendicular to the left guide rail 4 or the right guide rail 7). There may be one or several parallel ridges 28. Due to the ridge 28, the left and right guide rails 4, 7 have a line contact with power module 5, rather than a surface contact, so that not only plugging or assembling/disassembling of the power module 5 is facilitated because friction is reduced, but also scratches phenomenon on surface of the components is avoided, thereby the product quality is improved. Without a doubt, the ridge on inner side of the left and right guide rails 4, 7 may be designed in other forms, such as a bump group 26 consists of a plurality of bumps shown in FIG. 13. Each bump in the bump group 26 (the bumps are formed extending from the guide rail unit 4, 7 toward opposing inner sides of the guide rail unit 4, 7) has a cross section in an arc shape (here the cross section refers to a section taken by cutting the bump with a plane which is parallel to the rear mounting part 12 and perpendicular to the left guide rail 4 or the right guide rail 7). The ridge 28 or the bump group 26 can not only perform a function of primarily positioning the power module 5 in the width direction to preliminarily limits the moving of the power module 5 in the width direction, but also reduce friction between the power module 5 and the left and right guide rails 4, 7. A distance between the ridge 28 or the bump group 26 of the left guide rail 4 and the ridge 28 or the bump group 26 of the right guide rail 7 is larger than a width of the power module 5.

Figure 9:
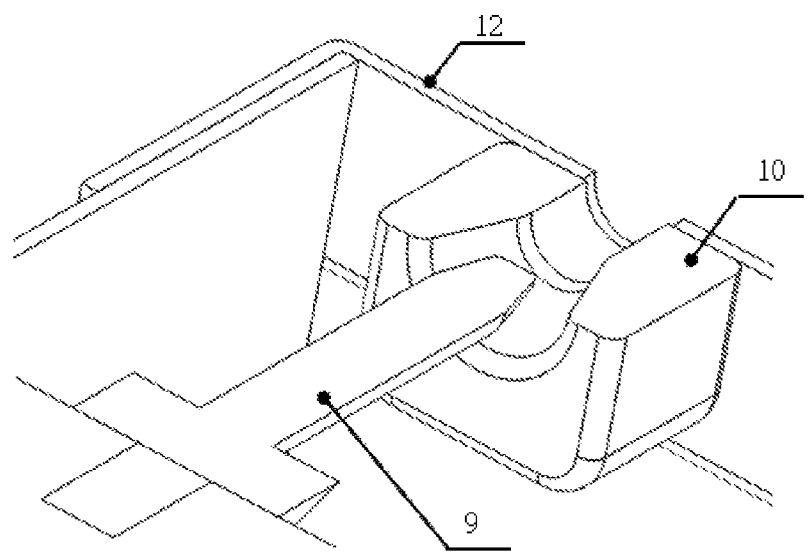
FIG. 9 is a partial enlarged view showing the alignment device for the power module according to the first embodiment of the disclosure.
Figure 14:
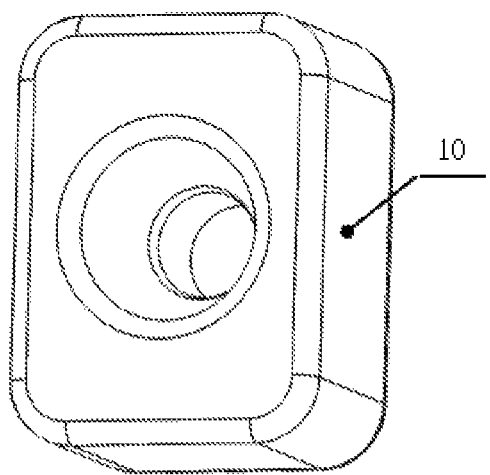
FIG. 14 is a schematic perspective view showing a guide sleeve of the alignment device for the power module according to the first embodiment of the disclosure.
Figure 15:
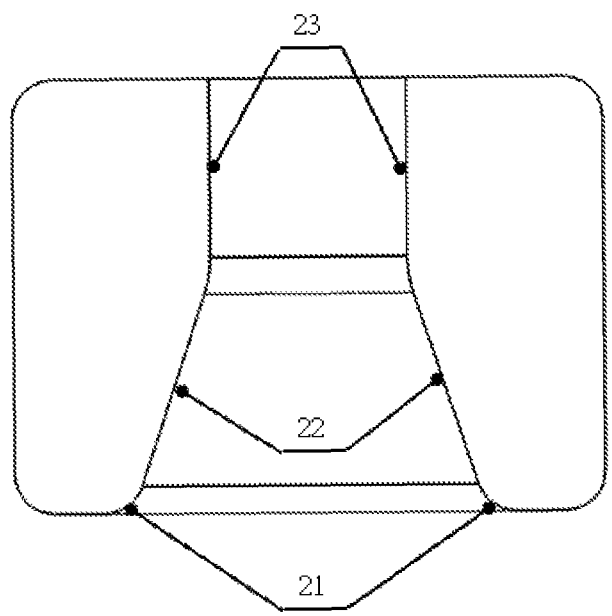
FIG. 15 is a cutaway view showing the guide sleeve of the alignment device for the power module according to the first embodiment of the disclosure.

The guide sleeve 10 ensures secondary positioning during plugging of the power module 5. The rear mounting part 12 is locked and fixed on inner side of the back plate of the cabinet. As shown in FIG. 5, the guide sleeve 10 and the socket 11 are locked on the rear mounting part 12. In order to increase balance and reliability, along the width direction of power module 5, a plurality of the guide sleeves 10 may be provided with number and positions matching the guide posts 9. The guide sleeve 10 may be subject to heat treatment to improve its stiffness, hardness and abrasive resistance. As shown in FIGS. 9, 14 and 15, the guide sleeve 10 may be provided with a guide part and an alignment part inside. More specifically, an end of the guide sleeve 10 away from the rear mounting part 12, i.e., the portion of the guide sleeve 10 firstly contacts the guide post 9, is the guide part, which is used to better guide the guide post 9 into the guide sleeve 10, so as to achieve accurately aligning. The guide part has a top end (i.e., contact end) being chamfered (or being round cornered), so as to protect the inner surface of the guide sleeve 10 contacting the guide post 9 and distribute local stress over the regions where the guide post 9 and the guide sleeve 10 contact each other. The other portion of the guide sleeve 10, from a rear end of the guide part (i.e., an end of the guide part away from its top end) to an end of the guide sleeve 10 close to the rear mounting part 12, is the alignment part.

Figure 7:
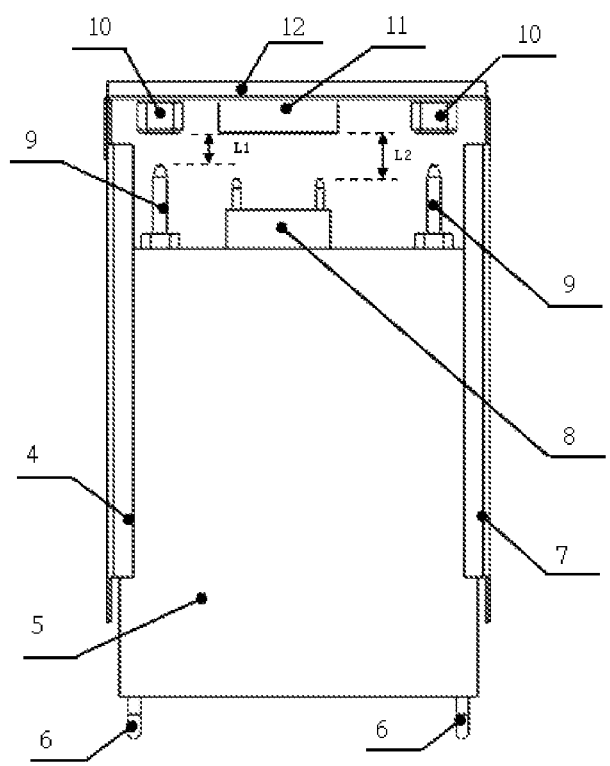
FIG. 7 is schematic top view showing the plugging process of the power module using the alignment device according to the first embodiment of the disclosure.
Figure 8:
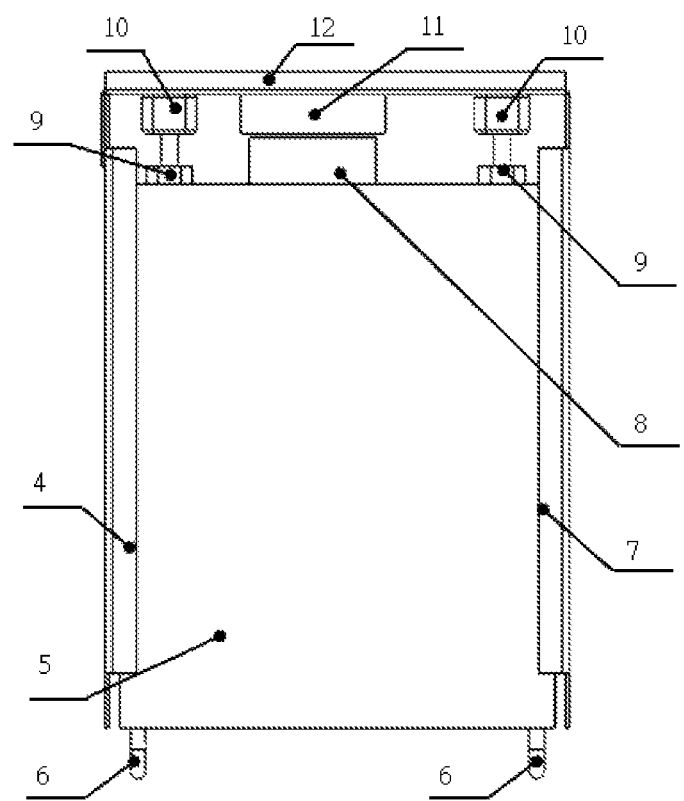
FIG. 8 is a schematic top view showing the power module has been mounted using the alignment device according to the first embodiment of the disclosure.

In the first embodiment of the disclosure, the accurate aligning process of the alignment device for the power module during plugging of the power module 5 is shown in FIGS. 4-8. FIG. 6 shows a schematic front view of the power module in plugging. FIGS. 4 and 7 shows a state in which the power module 5 is still advancing and about to contact the guide sleeve unit 3, and the secondary positioning is about to start. FIGS. 5 and 8 shows a state in which the power module 5 has advanced to an end position where it contacts the guide sleeve unit 3 to a maximum extent. The inserting or mounting is thus completed.

The inserting of the power module 5 will be discussed below.

As shown in FIGS. 4 and 7, when the power module 5 is inserted (or plugged in) from the front end of the cabinet (an end of the guide rail unit away from the rear mounting part 12), and moved toward the rear mounting part 12, because of the dimensional relationship L1<L2 (wherein, L1 is a distance between the top end of the guide post 9 and an opening end of the guide sleeve 10, the top end and the opening end are ends of the guide post 9 and the guide sleeve 10 respectively, which are firstly contact each other; L2 is a distance between a top end of the plug 8 and a top end of the socket 11, these top ends are ends of the plug 8 and the socket 11 respectively, which are firstly contact each other), the guide post 9 is connected to the guide sleeve 10 before the plug 8 is connected to the socket 11. In this case, the guide post 9 and the guide sleeve 10 can perform a function of secondary positioning for the power module 5 in its width direction, and finally limit the movement of the power module 5 in the width direction. The fit clearance between the guide post 9 and the guide sleeve 10 is designed such that the clearance at the contact end is larger than the clearance between the power module and the left and right guide rails, and clearance in the alignment part is less than the clearance between the plug 8 and the socket 11. Therefore, the inserting or drawing of the power module 5 can be guided by the matching between the guide post 9 and the guide sleeve 10, rather than just by fitting between the plug 8 and the socket 11. Thus, by means of matching between the guide post 9 and the guide sleeve 10, the mechanical stress between the plug 8 and the socket 11 can be shared by or distributed to the guide post 9 and the guide sleeve 10. In this case, the plug 8 and the socket 11 can be protected from damage, and the performance and reliability of the electric connection between the plug 8 and the socket 11 are improved. Moreover, a precise positioning is achieved at the same time.

The dismounting process of the power module 5 is described now. When the power module 5 is pulled out and moves toward the front end of the cabinet, similar to the inserting process described above, because of the relation L1<L2, the plug 8 is separated from the socket 11 before the guide post 9 is separated from the guide sleeve 10, the mechanical stress between the plug 8 and the socket 11 induced while the plug 8 being separated from the socket 11 can be shared by or distributed to the guide post 9 and the guide sleeve 10. As the power module 5 moves on the left and right guide rails 4, 7 in the direction away from the rear mounting part 12, the guide post 9 and the guide sleeve 10 are finally completely separated from each other, then the function of primary positioning is completely dependent on the ridge 28 or the bump group 26 on the inner side of the left guide rail 4 and the right guide rail 7. The primary positioning is only needed to preliminarily limit the movement of the power module 5 in its width direction, such that the guide post unit can be pulled out safely. For limiting the movement of the power module 5 in the width direction, the ridge 28 or the bump group 26 is not necessary; however, by means of the ridge 28 and the bump group 26, the friction in the moving of the power module 5 can be reduced, and the power module 5 can be protected from damage.

In the above plugging process of the power module 5, a fit clearance between the accommodating component and the accommodated component is necessary, wherein, the power module 5 is the accommodated component, and the left and right guide rails 4, 7, as well as the ridge 28 or the bump group 26 disposed on the inner surfaces of the left and right guide rails 4, 7, are the accommodating components; moreover, the plug 8 and the guide post 9 are the accommodated components, and the socket 11 and the guide sleeve 10 are the accommodating components. A fit clearance means that the movement of the accommodated component inside the accommodating component may have an offset, and this offset is a size difference between a maximum contour size of the accommodated component and a minimum matching size of the accommodating component. As shown in FIG. 6, in the case that the ridge 28 or the bump group 26 is provided, if the offset of the left and right guide rails 4, 7 for limiting the power module is indicated as A, then A equals to the distance A1 between the ridge 28 or the bump group 26 (on the inner surfaces of the left and right guide rails 4, 7 shown in FIG. 6) reduced by the width A2 of the power module, that is, A=A1−A2. In the case that neither the ridge 28 nor the bump group 26 is provided, A1 is an inner spacing between the left rail 4 and the right guide rail 7.

Figure 16:
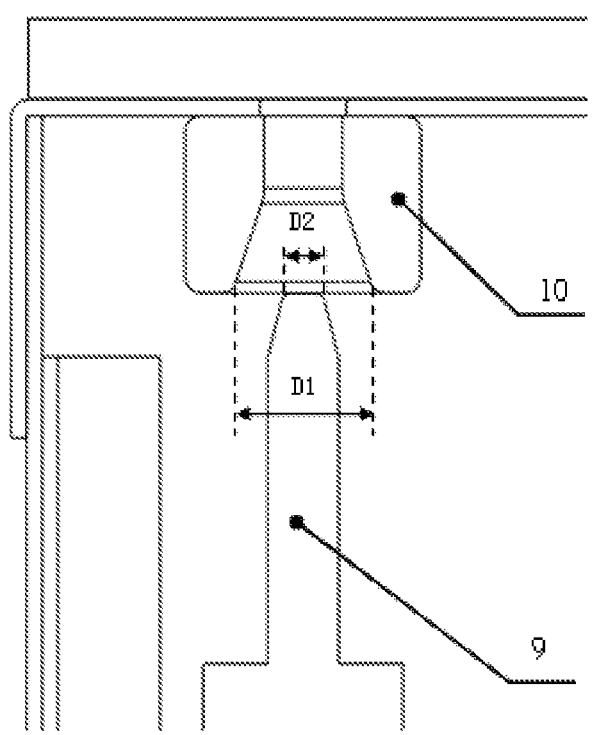
FIGS. 16-18 are schematic diagrams showing a fitting process of the guide sleeve and the guide post during the plugging of the power module using the alignment device according to the first embodiment of the disclosure.

As shown in FIGS. 15-16, the guide sleeve 10 is provided with the guide part and the alignment part inside with respect to the guide post 9. As the section of the guide sleeve 10 (i.e., the section taken by cutting the guide sleeve 10 with a plane which is parallel to the plugging direction of the power module 5) shown, the diameter of the guide part 22 decreases gradually. When the power module 5 is plugged in, the front end of the guide post 9, after passes through the guide part 22, will enter the portion of the guide sleeve 10 having a consistent diameter. This portion of the guide sleeve 10 has a function of aligning the guide post 9, and thus is called the alignment part 23. The end of the guide part 22 away from the alignment part 23 is the receiving end 21, in other words, the opening end of the guide sleeve 10 is the receiving end 21. Without a doubt, there may also have a receiving part having a consistent cross-section diameter which is of the same size as the receiving end. In other cases, the guide part may not be provided for the guide sleeve 10, but instead provided only for the guide post 9. In such a case, the portion of the guide part of the guide post 9 having a consistent cross-section diameter may correspond to the alignment part, and the end of the guide part away from the alignment part is the receiving end. As shown in FIG. 16, if the offset of power module 5 limited by the receiving end 21 is indicated as D, then D equals to the inner diameter D1 of the receiving end 21 of the guide sleeve 10 (i.e., the inner diameter of the opening end of the guide part of the guide sleeve 10) minus the outer diameter D2 of the top end of the guide post 9 (the outer diameter of the top end of the guide post 9 is the outer diameter of the chamfer of the guide part 24 of the guide post 9), that is, D=D1−D2. The offset D≥A, so the power module 5 can be smoothly guided by the guide post 9 and the guide sleeve 10 while power module 5 is moving along the guide rail unit 2.

Figure 17:
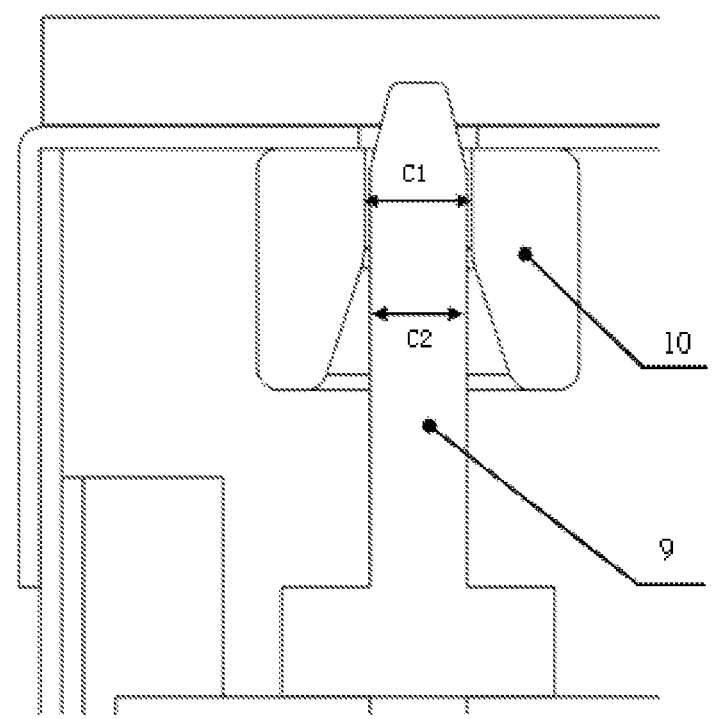
Figure 18:
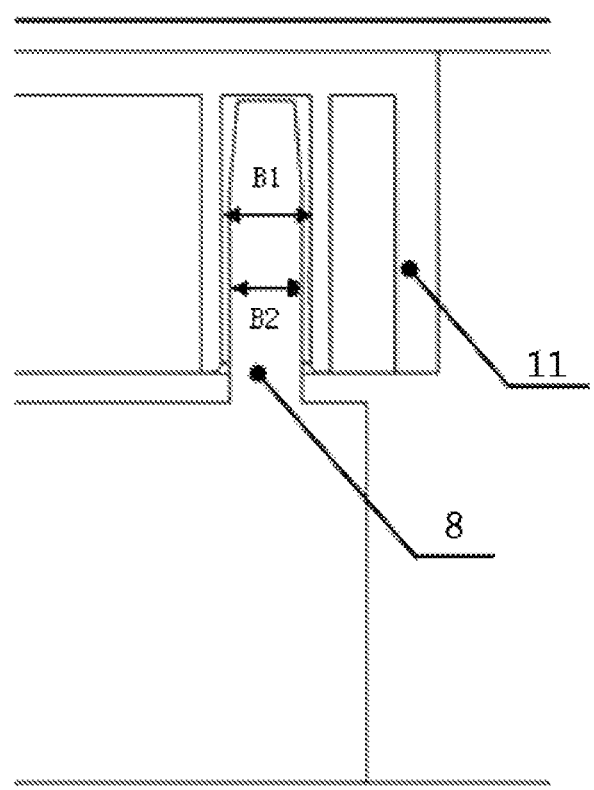

As shown in FIG. 17, if an offset of the power module 5 limited by the alignment part 90 of the guide post 9 and the alignment part 23 of the guide sleeve 10 is indicated as C, then C equals to the inner diameter C1 of the alignment part 23 of the guide sleeve 10 minus the outer diameter C2 of the alignment part 90 of the guide post 9, that is, C=C1−C2. As shown in FIG. 18, if an offset of the power module 5 limited by connecting of the plug 8 and the socket 11 is indicated as B, then B equals to the inner diameter B1 of the socket 11 minus the outer diameter B2 of the plug 8, that is, B=B1−B2. The offset B≥C, so the mechanical stress produced when the plug 8 is connected to the socket 11 can be reduced. The offset D may be, for example, 2-3 mm. The offset A may be, for example, 1-2 mm. The offset B may be, for example, 0.5 mm. The offset C may be, for example, 0.1-0.2 mm. Moreover, both of the guide part of the guide post 9 and the guide part of inner side of the guide sleeve 10 are used to guide the guide post 9 into the guide sleeve. Therefore, one guide part disposed on either the guide post 9 or the inner side of the guide sleeve 10, or two guide parts disposed on the guide post 9 and guide sleeve 10, respectively, can perform the function of guiding the guide post 9 into the guide sleeve 10. The handle unit is a component used to facilitate plugging of the power module 5. It may be designed to have only one handle.

The Second Embodiment

Figure 19:
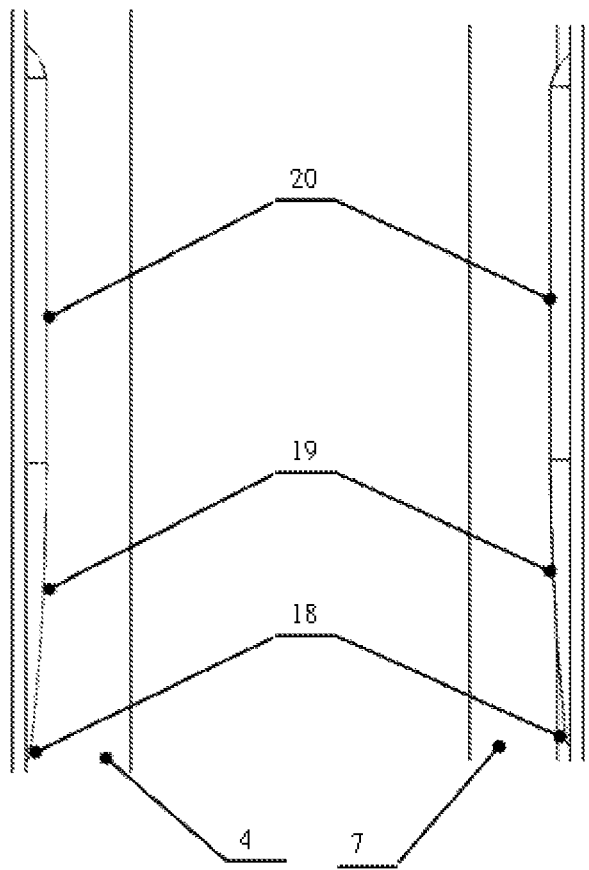
FIG. 19 is a schematic top view showing a guide device of the alignment device for the power module according to a second embodiment of the disclosure.
Figure 20:
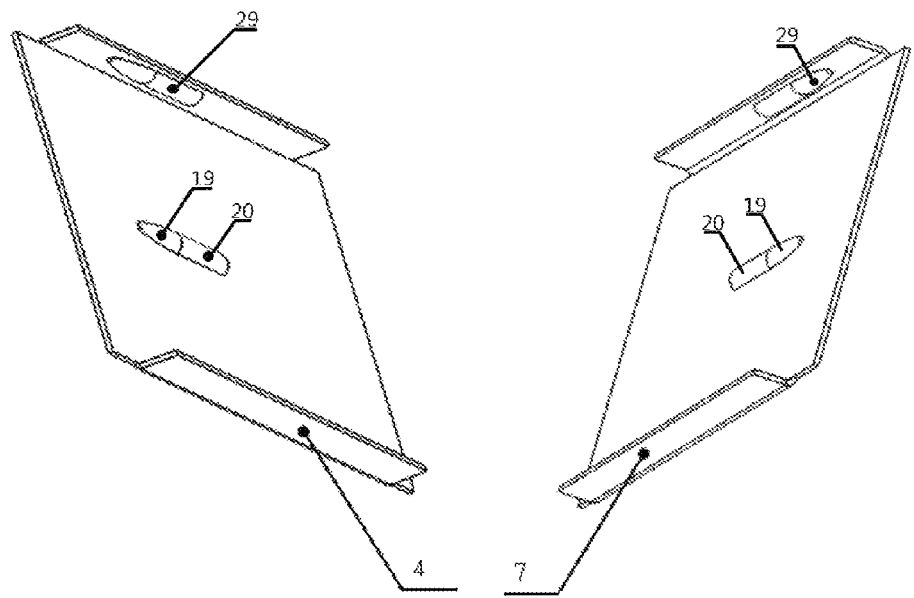
FIG. 20 is a schematic perspective view showing the guide device of the alignment device for the power module according to the second embodiment of the disclosure.

As shown in FIGS. 19 and 20, the difference between the alignment device for the power module of the second embodiment and the alignment device for the power module of the first embodiment lies in that in the second embodiment, the secondary positioning in plugging of the power module 5 is performed by the ridges acting as the guide devices and disposed on the inner surfaces of the left and right guide rails 4, 7 (it is also possible that the ridges are disposed only on one of the guide rails), instead of by the guide post unit and the guide sleeve unit.

As shown in FIG. 19, the alignment part 20 and the guide part 19 are formed by the ridges of different heights disposed on the inner surfaces of the left and right guide rails 4, 7 (the height of the ridge is the extending length of the ridge toward the inner side of the opposing guide rail, as shown in FIG. 19). In the alignment part 20, all the ridges have a consistent height, however, in the guide part 19, the ridges have different heights. Specifically, the front end of the guide part 19 corresponds to the receiving end 18. The ridge at the receiving end 18 has a zero height, and other ridges in the guide part 19 have heights increasing from 0 to the height of the ridges in the alignment part 20. Here, the offset D of the power module 5 limited by the receiving end 18 equals to the spacing between the two receiving ends 18 on the left and right guide rails 4, 7 minus the width of the power module 5. The offset C of the power module 5 limited by the alignment part 20 equals to the spacing between the two alignment parts 20 on the left and right guide rails 4, 7 minus the width of the power module 5. The offset A of the power module 5 limited by the guide rail unit 2 equals to the inner spacing between the left and right guide rails 4, 7 minus the width of the power module 5. Moreover, the offset B of the power module 5 limited by the connection of the plug 8 and the socket 11 equals to the inner diameter of the socket 11 minus the outer diameter of the plug 8. The respective offsets meet a relation that the offset D equals to the offset A, and the offset B is larger than the offset C.

As shown in FIG. 20, the alignment device for the power module according to the embodiment may comprise ridges 29 disposed on the inner sides of the tops of the left guide rail 4 and the right guide rail 7, so as to guide and control the movement of the power module 5 in the vertical direction. The shape of the ridges 29 may be the same as the shape of the ridge disposed on the inner side of the left guide rail 4 and the right guide rail 7 and comprising the guide part 19 and the alignment part 20.

In this embodiment, secondary positioning may also be performed by ridges comprising the guide part 19 and the alignment part 20 as well as the guide post 9 and the guide sleeve 10 together. In such a case, the respective offsets should still meet the relation that the offset D equals to the offset A, and the offset B is larger than the offset C.

The Third Embodiment

Figure 21:
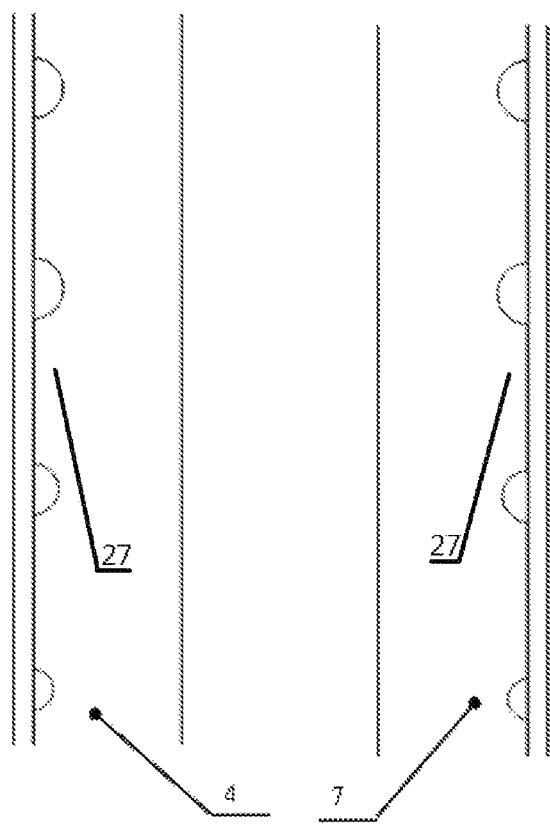
FIG. 21 is a schematic top view showing the guide device of the alignment device for the power module according to a third embodiment of the disclosure.
Figure 22:
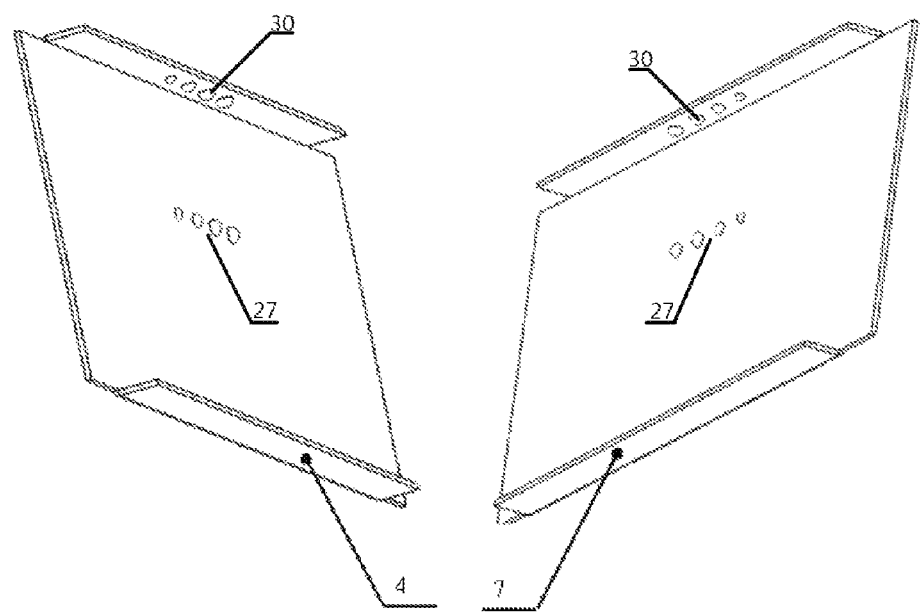
FIG. 22 is a schematic perspective view showing the guide device of the alignment device for the power module according to the third embodiment of the disclosure.

Different from the second embodiment, in this embodiment, as shown in FIGS. 21 and 22, the ridges having the guide part 19 and the alignment part 20 in the second embodiment are replaced by a bump group 27 (or bump groups) consisting of a plurality of bumps for performing secondary positioning during plugging of the power module 5. The bump group 27 is provided with a guide part and an alignment part.

Specifically, as shown in FIG. 21, the bump group 27 are disposed on inner surface(s) of the left and right guide rails 4, 7. In the bump group 27, the bumps located in the rear have the same height and form an alignment part, and the bumps located in the front have heights gradually varying and form a guide part. The receiving end of the guide part corresponds to the bumps of zero height, in other words, the left and right guide rails 4, 7 themselves serve as the receiving part.

Moreover, as shown in FIG. 22, in the alignment device for the power module according to the embodiment, a bump group 30 consisting of a plurality of bumps may be disposed on the inner side of the tops of the left guide rail 4 and the right guide rail 7 for guiding and controlling movement of the power module 5 in the vertical direction. The shape of the bumps 30 may be the same as the shape of the bump group 27 disposed on the inner surfaces of the left guide rail 4 and the right guide rail 7 and having the guide part and the alignment part. Alternatively, in the alignment device for the power module according to the embodiment, ridges may be disposed on the inside of the top of the left and right guide rails 4, 7, for guiding and controlling the movement of the power module 5 in vertical direction. The shapes of the ridges may be the same as that of the ridges of the second embodiment which are disposed on the surfaces of the inner side of the left guide rail 4 and the right guide rail 7 of the alignment device and have the guide part 19 and the alignment part 20.

In other embodiments, for example, the guide rail unit 2 may be implemented through ridges, and the guide rail 160 disposed at the bottom of the power module 5 may be replaced by the bump group. Alternatively, the guide rail unit 2 may be implemented through the bump group, and the guide rail 160 may be replaced by the ridges.

Exemplary embodiments of the disclosure provide at least one or more of the following advantageous effects. For example, the alignment device for the power module according to the disclosure performs primary positioning mainly by the guide rail unit, and performs secondary positioning by a guide post, a guide sleeve, a ridge, and/or a bump group, so as to achieve accurate positioning in plugging of the power module. Consequently, the power module according to the disclosure is easy and reliable to be operated, and has a safe, simple, compact structure. The mechanical stress produced in connecting of the plug and the socket of the connector can be reduced. The connector itself can be protected from damage even if the product has a heavy weight.

It should be noted that the above embodiments is only illustrated for describing the technical solution of the disclosure and not limitative, and although the disclosure is described in detail by referring to the aforesaid embodiments, the skilled in the art should understand that the aforesaid embodiments can be modified and portions of the technical features therein may be equally changed, which does not depart from the spirit and scope of the disclosure as defined in the appended claims.

What is claimed is:

1. An alignment device for a power module of a power electronic device, for aligning the power module while the power module being plugging to or from a rear mounting part of a cabinet of the power electronic device, wherein the rear mounting part is disposed at an inner side of a back plate of the cabinet, the alignment device comprises
a first connector disposed on the power module,
guide rail units disposed on inner sides of a left side plate and a right side plate of the cabinet,
a second connector disposed on the rear mounting part, and
a guide device for limiting an offset of the power module moving along the guide rail unit,
wherein a movement of the power module toward the rear mounting part along the guide rail unit causes the first connector to connect to the second connector, such that the first connector is electrically connected to the second connector,
wherein the guide device comprises a guide part and an alignment part, and one end of the guide part away from the alignment part is a receiving end,
wherein the receiving end defines a first offset of the power module, the alignment part defines a second offset of the power module, the guide rail unit defines a third offset of the power module, the connection between the first connector and the second connector defines a fourth offset of the power module;
wherein the first offset is equal to or greater than the third offset, the fourth offset is equal to or greater than the second offset.

2. The alignment device according to claim 1, wherein the guide device further comprises a receiving part connected with the receiving end and having a same width as that of the receiving end.

3. The alignment device according to claim 1, wherein the guide device is a ridge or a bump group disposed on an inner surface of the guide rail unit.

4. The alignment device according to claim 3, wherein the ridge or each bump of the bump group has a cross section of an arc shape.

5. The alignment device according to claim 4, wherein the guide device further comprises a ridge or a bump group disposed on an inner surface of a top of the guide rail unit, which forms a guide part and an alignment part.

6. The alignment device according to claim 5, wherein the ridge or the bump group disposed on the inner surface of the top of the guide rail unit and the ridge or the bump group disposed on the inner side surface of the guide rail unit have same shapes.

7. The alignment device according to claim 1, wherein the guide device comprises a guide post and a guide sleeve fitting each other, with one of the guide post and the guide sleeve disposed on the power module, and the other disposed on an inner side of the rear mounting part; and the guide part is disposed at a top end of the guide post and/or an opening end of the guide sleeve.

8. The alignment device according to claim 7, wherein the top end of the guide part is provided with a chamfer.

9. The alignment device according to claim 7, wherein a distance from a top of the first connector to a top of the second connector is greater than a distance from the top end of the guide post to the opening end of the guide sleeve.

10. The alignment device according to claim 7, wherein a ridge or a bump group is disposed on an inner surface of the guide rail unit.

11. The alignment device according to claim 10, wherein the ridge or each bump of the bump group has a cross section of an arc shape.

12. The alignment device according to claim 1, wherein the guide rail unit comprises two separated guide rails in L, U or C shape.

13. The alignment device according to claim 1, wherein the guide rail unit is an integral guide rail in a U or rectangle shape.

14. The alignment device according to claim 1, wherein a handle unit is disposed at a front panel of the power module.

15. The alignment device according to claim 1, wherein the rear mounting part is disposed on an inner surface of the back plate.

16. The alignment device according to claim 1, wherein the rear mounting part is disposed on two mounting rack inside the back plate.

17. The alignment device according to claim 1, wherein the rear mounting part is disposed at a rear end of the guide rail unit.

18. A power electronic device, wherein the power electronic device comprises the alignment device according to claim 1.

* * * * *